(12) United States Patent
Yamamoto

(10) Patent No.: US 7,972,755 B2
(45) Date of Patent: Jul. 5, 2011

(54) SUBSTRATE PROCESSING METHOD AND SUBSTRATE PROCESSING SYSTEM

(75) Inventor: Yuichi Yamamoto, Minato-Ku (JP)

(73) Assignee: Tokyo Electron Limited, Minato-Ku, Tokyo-To (JP)

( * ) Notice: Subject to any disclaimer, the term of this patent is extended or adjusted under 35 U.S.C. 154(b) by 260 days.

(21) Appl. No.: 12/446,289

(22) PCT Filed: Nov. 14, 2007

(86) PCT No.: PCT/JP2007/072117
§ 371 (c)(1),
(2), (4) Date: Apr. 20, 2009

(87) PCT Pub. No.: WO2008/059891
PCT Pub. Date: May 22, 2008

(65) Prior Publication Data
US 2010/0009274 A1    Jan. 14, 2010

(30) Foreign Application Priority Data
Nov. 14, 2006  (JP) ................................. 2006-307387

(51) Int. Cl.
*G03F 9/00* (2006.01)
*G03C 5/00* (2006.01)

(52) U.S. Cl. .......... 430/30; 430/312; 430/313; 430/316; 430/328; 430/330; 118/58; 414/935; 414/937; 700/2; 700/19; 700/20; 700/121

(58) Field of Classification Search ............ 430/30, 430/312, 313, 316, 328, 330; 118/58; 414/935, 414/937; 700/2, 19, 20, 121
See application file for complete search history.

(56) References Cited

U.S. PATENT DOCUMENTS
2002/0009658 A1  1/2002  Sato et al.
2002/0116076 A1  8/2002  Yoshimoto et al.

FOREIGN PATENT DOCUMENTS
| JP | 07-066265 A1 | 3/1995 |
| JP | 2001-351846 A1 | 12/2001 |
| JP | 2002-026107 A1 | 1/2002 |
| JP | 2002-196815 A1 | 7/2002 |

*Primary Examiner* — Christopher G Young
(74) *Attorney, Agent, or Firm* — Burr & Brown

(57) ABSTRACT

There is disclosed a substrate processing method by a multi-patterning technique, which comprises a lithography process and an etching process, each of the processes is performed to one substrate at least twice. The substrate processing method is performed by using a substrate processing system comprising a plurality of process units for performing respective steps of the lithography process. When a second lithography process is performed to a substrate, process unit(s) for performing one or more steps of the second lithography process to be used in the second lithography process is automatically selected based on the process history of the first lithography process in such a way that the process unit(s) to be used in the second lithography process is (are) identical to the processed unit(s) used in the first lithography process.

12 Claims, 10 Drawing Sheets

SUBSTRATE PROCESSING METHOD AND SUBSTRATE PROCESSING SYSTEM

FIELD OF THE INVENTION

The present invention relates to a substrate processing method and a substrate processing system that perform a lithography process to a substrate such as a semiconductor wafer and an LCD glass substrate.

BACKGROUND ART

In manufacturing of a semiconductor device, a photolithography process is generally used for forming an ITO (Indium Tin Oxide) film or an electrode pattern on a substrate such as a semiconductor wafer and an LCD glass substrate. Such a photolithography process coats a substrate with photoresist (hereinafter simply referred to as "resist") to form a resist film, exposes the resist film so as to transfer thereto a predetermined circuit pattern, and develops the resist film, so that a desired pattern is formed in the resist film.

The above steps are generally performed by a coating and developing system, which includes various types of process units such as a resist coating unit that coats a substrate with a resist liquid, a baking unit that performs a heating treatment to a substrate that has been subjected to a resist coating step and a substrate that has been subjected to an exposure step, and a development unit that develops an exposed substrate by supplying thereto a developer, wherein every type of process unit numbers plural.

In recent years, there are growing needs of further miniaturization of a device pattern. As one of the solutions for achieving miniaturization, a so-called, multi-patterning technique that performs the lithography process two or more times has been studied. In addition to the multiple lithography processes, the multi-pattering technique requires an etching process for microfabrication of a resist.

There have been conventionally known systems in which a substrate is transferred to a plurality of processing apparatuses for the lithography process and an etching apparatus so that the substrate is subjected to the lithography processes and the etching processes. Some of such systems are configured to repeatedly perform the lithography process (see, claims and FIG. 1 of JP7-66265A, for example).

In the system disclosed in JP7-66265A, since the lithography process can be repeatedly performed, multiple patterns can be formed on a substrate. However, in such a system, since the process schedule for each process unit is determined with placing the top priority on throughput, the relationship between the process unit used for the first lithography process and the process unit used for the second lithography process is not managed. Thus, there may be a problem in that, due to the individual difference among the process units, misalignment or pattern dimension difference between the pattern formed by the first lithography process and the pattern formed by the second lithography process may occur, resulting in insufficient accuracy of the finally obtained pattern.

DISCLOSURE OF THE INVENTION

The present invention has been made in view of the above circumstances, and it is therefore the object of the present invention to provide a substrate processing method and a substrate processing system that can improve a patterning dimension accuracy of a miniaturized device.

In order to achieve the above objective, the present invention provides a substrate processing method comprising a lithography process and an etching process, each of the processes is performed to one substrate at least twice, wherein the lithography process includes a plurality of steps for forming a mask having a predetermined pattern on the substrate, wherein the etching process etches the substrate by using the mask formed by the lithography process, and wherein said substrate processing method is performed by using a substrate processing system having a plurality of process unit groups respectively assigned to said plurality of process steps, and each of the process unit groups includes a plurality of process units of a same type, said method further comprising the steps of: judging whether a lithography process to be performed to a substrate from now is a first lithography process to the substrate, or a second or more lithography process to the substrate; and determining process units to be used in the lithography process to be performed from now, by selecting one process unit from each of the process unit groups in such a way that at least one process unit to be used in the lithography process to be performed to the substrate from now is identical to a process unit used in a lithography process performed to the substrate most recently, if the judging step judges that the lithography process to be performed to the substrate from now is a second or more lithography process to the substrate.

Further, the present invention provides a substrate processing system comprising: a substrate loading and unloading part at which substrates is loaded and unloaded to and from said substrate processing system; a coating and developing part, which includes a process unit group consisting of a plurality of resist coating units each having a substantially identical structure, a process unit group consisting of a plurality of post-exposure baking units each having a substantially identical structure and a process unit group consisting of a plurality of developing units each having a substantially identical structure, and which is thus configured to be capable of performing a plurality of steps of a lithography process except for an exposure step; an interface part provided to transfer a substrate between an exposure apparatus and the coating and developing part; substrate transfer means provided to transfer a substrate among the substrate loading and unloading part, the coating and developing part and the interface part, and to transfer a substrate in the coating and developing part; and a control part configured to control at least the plurality of process units and the substrate transfer means; wherein the control part includes: means for judging whether a lithography process to be performed to a substrate from now is a first lithography process to the substrate, or a second or more lithography process to the substrate; and means for determining process units to be used in the lithography process to be performed from now, by selecting one process unit from each of the process unit groups in such a way that at least one process unit to be used in the lithography process to be performed to the substrate from now is identical to a process unit used in a lithography process performed to the substrate most recently, if the judging means judges that the lithography process to be performed to the substrate from now is a second or more lithography process to the substrate.

Preferably, the second or more lithography process uses process units selected in such a manner that at least one of the resist coating unit, the post-exposure baking unit and the developing unit is the same as that used in the most recent lithography process. More preferably, all of the resist coating unit, the post-exposure baking unit and the developing unit that are to be used are the same as those used in the most recent lithography process.

When a plurality of etching units are incorporated in the substrate processing system, in the second or more etching process, it is preferable to use the etching unit used in the most recent etching process.

DESCRIPTION OF PREFERRED EMBODIMENTS

Preferred embodiments of the present invention will be described in detail below, with reference to the accompanying drawings. Described herebelow is a case in which a substrate processing system of the present invention is applied to a resist coating and developing system for a semiconductor wafer.

Figure 1:
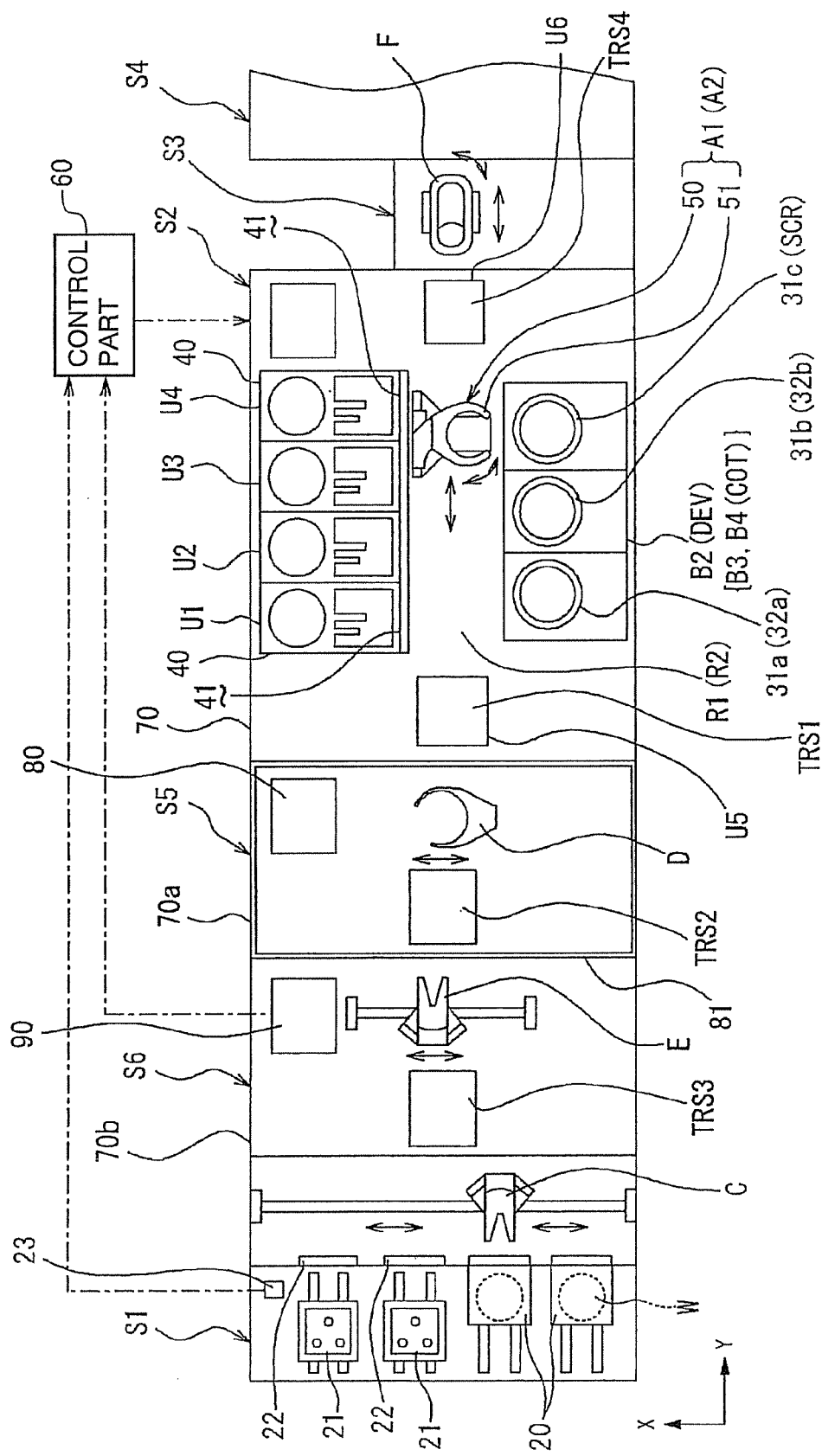
FIG. 1 is a schematic plan view showing a first embodiment of a resist coating and developing system in a first embodiment of a substrate processing system according to the present invention.
Figure 2:
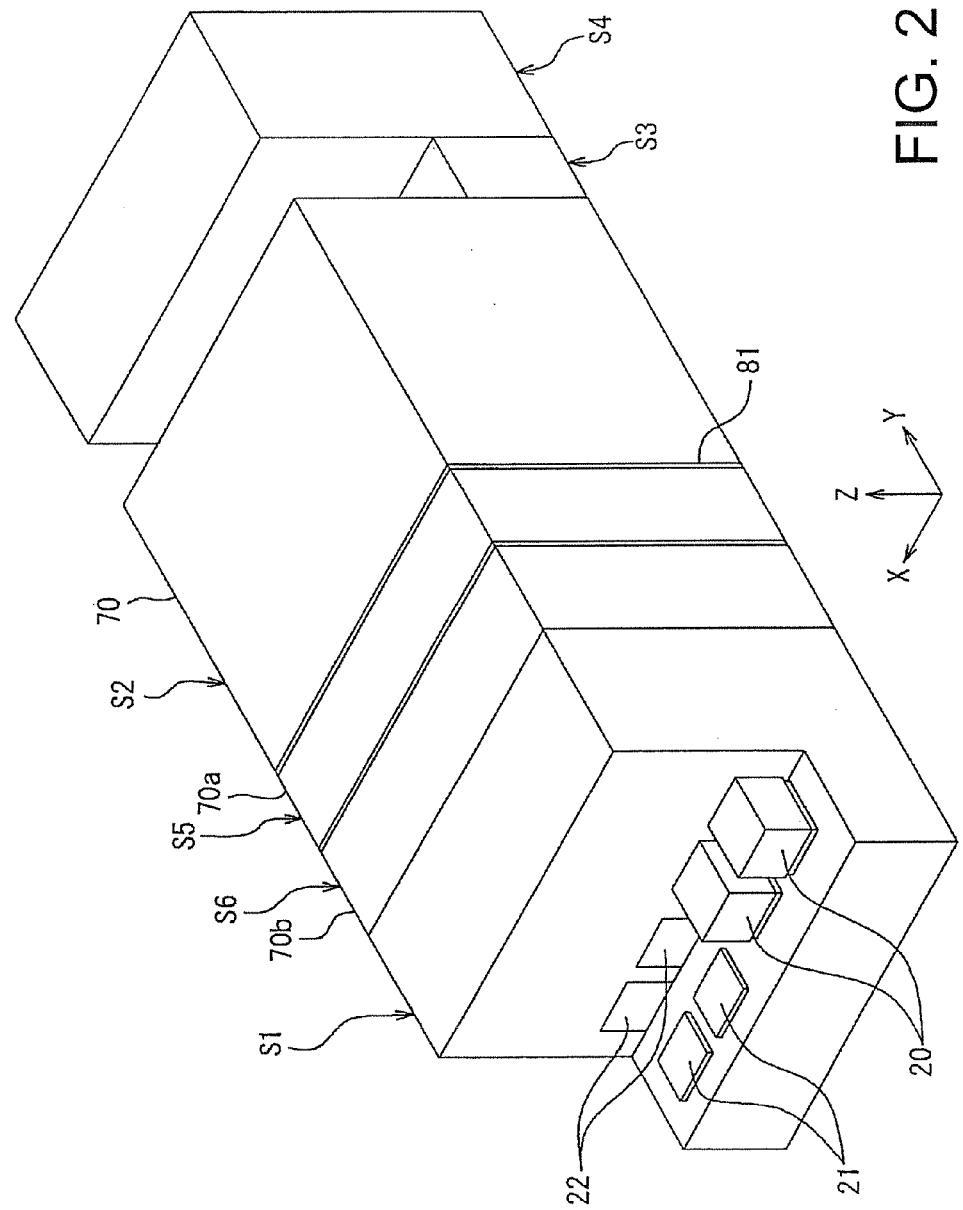
FIG. 2 is a schematic perspective view of the resist coating and developing system shown in FIG. 1.
Figure 3:
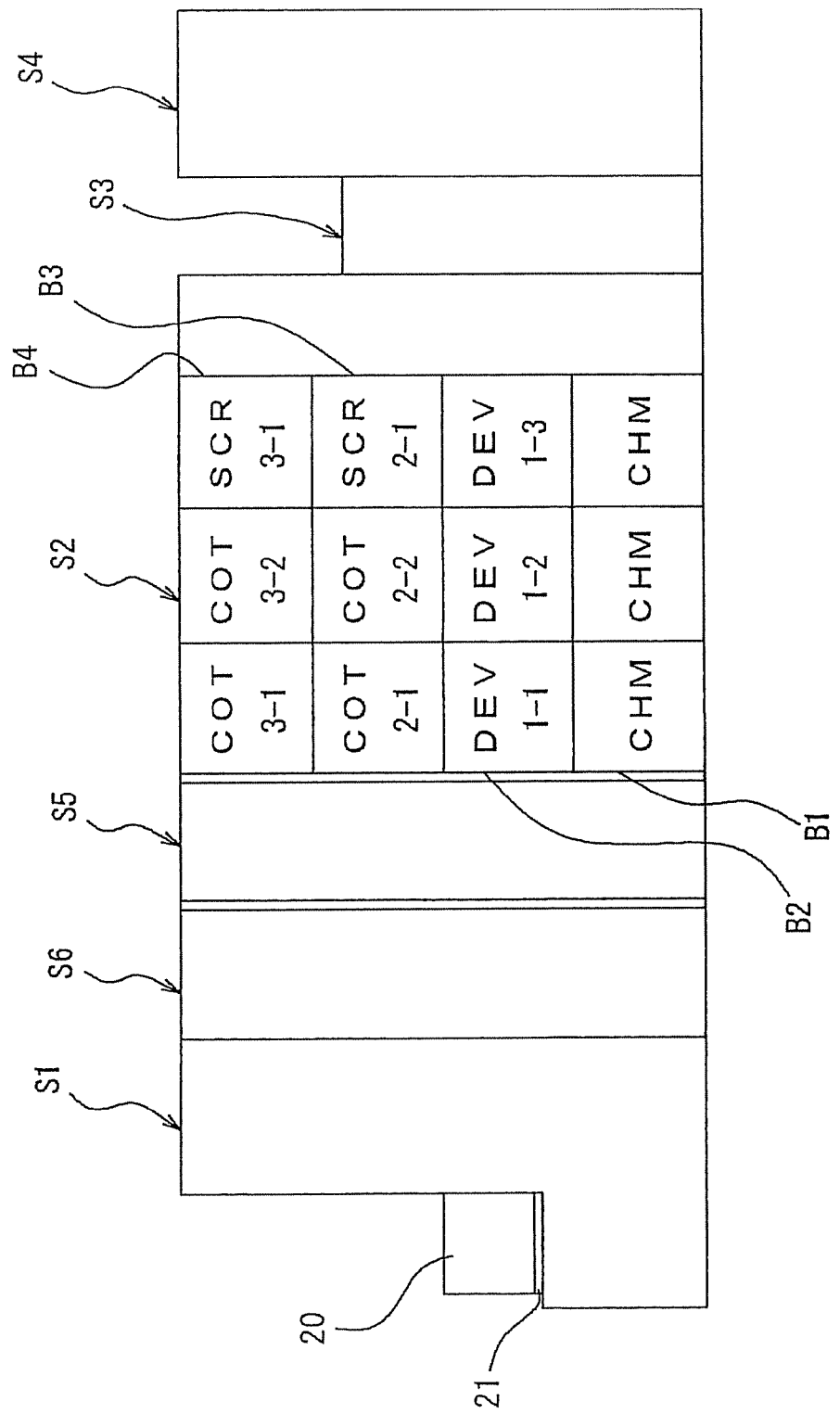
FIG. 3 is a schematic front view of the resist coating and developing system shown in FIG. 1.
Figure 4:
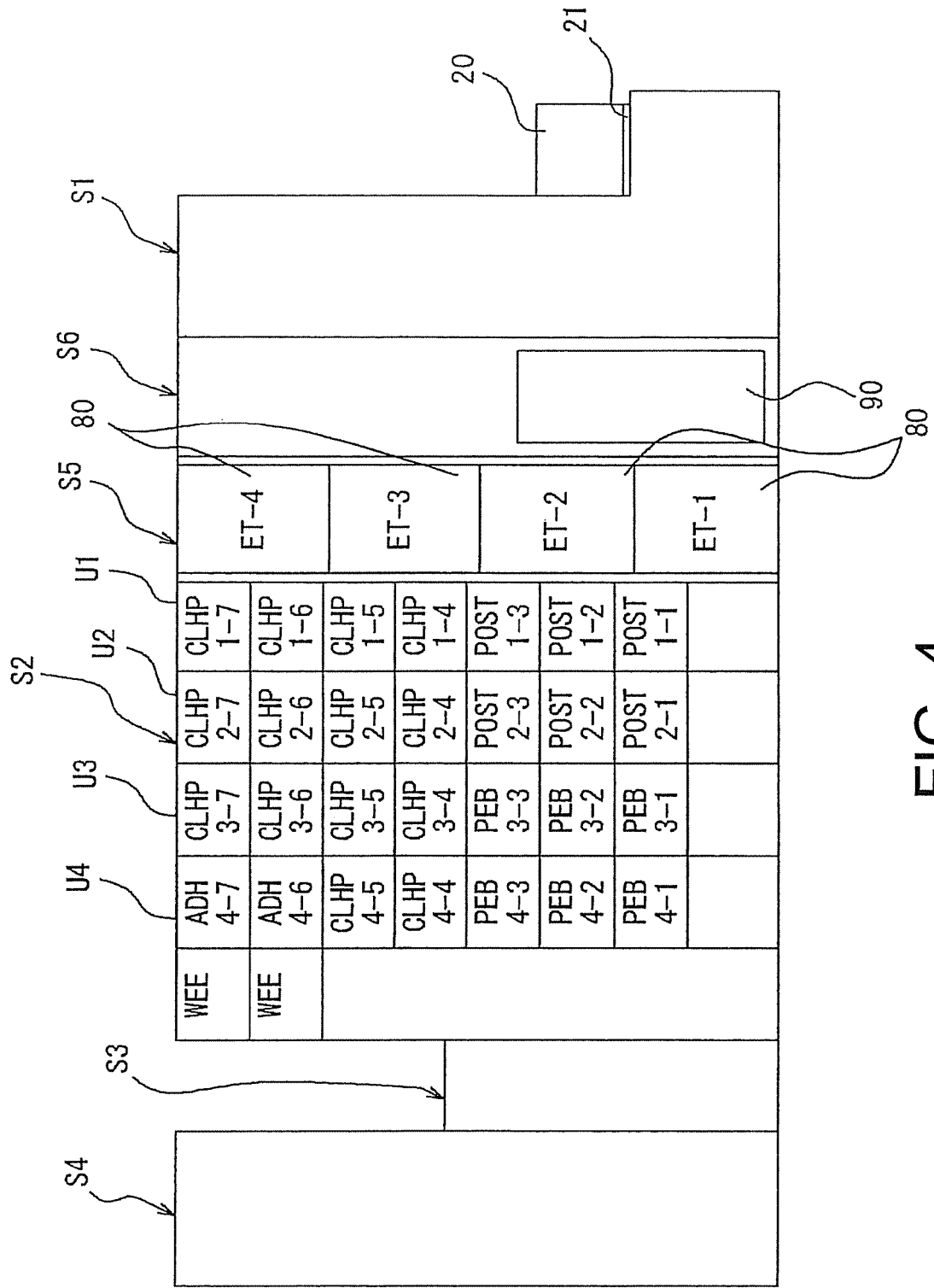
FIG. 4 is a schematic rear view of the resist coating and developing system shown in FIG. 1.

FIG. 1 is a schematic plan view of a first embodiment of a resist coating and developing system of the present invention. FIG. 2 is a schematic perspective view thereof. FIG. 3 is a schematic front view thereof. FIG. 4 is a schematic rear view thereof.

The resist coating and developing system includes: a carrier block (loading and unloading part) S1 at which a carrier 20, which hermetically accommodates a plurality of, e.g., twenty five semiconductor wafers W (hereinafter simply referred to as "wafer") as substrates to be processed, is loaded and unloaded to and from the system; a coating and developing block (coating and developing part) S2 (hereinafter simply referred to as "process block S2") that is constituted by vertically arranging a plurality of, e.g., four unit blocks B1 to B4; an interface block (interface part) S3; and an exposure apparatus S4. The resist coating and developing system further includes, between the carrier block S1 and the process block S2, an etching block (etching part) S5 disposed on the side of the process block S2, and a measuring block (measuring part) S6 disposed on the side of the carrier block S1. The resist coating and developing system is provided with arms A1, A2, C, D, and E (described later), which serve as transfer means (transfer system) that transfer wafers W among the respective blocks S1 to S6, among the process units in the blocks, and between process units of the etching block S5.

Provided in the carrier block S1 are: a table 21 on which the plurality of (e.g., four) carriers 20 can be placed; shutters 22 disposed on a wall body in front of the table 21 ("front" means a positive direction in the Y-axis in FIG. 1, which holds true in the following description); and the transfer arm C that takes a wafer W from the carrier 20 through the shutter 22. The transfer arm C is capable of moving the horizontal X and Y directions and the vertical Z direction, and of rotating about the vertical axis, such that a wafer W can be transferred to and from a transfer stage TRS3 disposed in the measuring block S6.

Detecting means 23 that reads an identification (not shown) attached to the carrier 20 is disposed near the shutter 22 of the carrier block S1. As will be understood from the below description, when the identification is specified, the process history of wafers W (in detail, the number of times of lithography process and etching process performed to the wafers W, and process units used for these processes) accommodated in the carrier 20 can be specified.

The detecting means 23 is electrically connected to a control part 60, and a detection signal generated by the detecting means 23 is transmitted to the control part 60. Thus, the number of times of the lithography process and the number of times of the etching process, which are to be performed to the wafers W from now, can be judged.

The control part 60 may be formed of a computer. The computer has a storage part. Stored in the storage part is a control program for selecting or determining process units to be used in the processes to wafers W, for selecting or determining a wafer transfer schedule, and for controlling process units and the transfer means A1, A2, C, D and E in line with the wafer transfer schedule. When the program is executed by the computer, i.e., the control part 60, the control part 60 generates commands to control operations of the transfer means A1, A2, C, D, and E, and the process units. The program stored in the storage part with the program being stored in a storage medium such as a hard disc, a compact disc, a magnetoptical disc, and a memory card.

The process block S2 encompassed by a housing 70 is connected to the front part of the carrier block S1 through the measuring block S6 and the etching block S5. In the processing block S2, there are stacked: the first unit block (CHM) B1 that accommodates containers of chemical liquids such as a resist liquid and a developer; the second unit block (also referred to as "DEV layer") B2 that performs a developing step; the third unit block (also referred to as "COT layer") B3 that performs a resist liquid coating step and a cleaning step; and the fourth unit block (also referred to as "COT layer") that performs a resist liquid coating step and a cleaning step; in that order from below. The third unit block (COT layer) B3 may be replaced with a unit block (BCT layer) that performs a step for forming an antireflection film below a resist film. A unit block that performs a step for forming an antireflection film above a resist film may be further stacked on the fourth unit block B4.

The first to fourth unit blocks B1 to B4 are equipped with: a plurality of liquid process units arranged on the right side of the processing block S2 to perform various liquid process steps; a plurality of heat treatment units (and other types of process units) arranged on the left side of the processing block S2 to perform various heating treatments as pre-treatment and post-treatment of the liquid processes; and the main arms A1 and A2 which are substrate transfer means exclusively used for transferring wafers W among the aforementioned units.

The unit layouts in the respective unit blocks B1 to B4 are substantially the same. Namely, the center positions of wafers W placed in the respective process units (e.g., the center position of a spin chuck (i.e., means for holding wafers W in the liquid process unit), the center position of a heating plate and a cooling plate of the heat treatment unit) are substantially the same among the respective unit blocks.

As shown in FIG. 1, a wafer transfer area R1 (area where the main arm A1 horizontally moves), whose opposite ends are in communication with the etching block S5 and the interface block S3, respectively, is provided in a substantially center region of the DEV layer B2 to extend in the longitudinal direction (Y direction in FIG. 1) of the DEV layer B2. Similarly to the DEV layer B2, wafer transfer areas R2 (areas where the main arms A2 horizontally moves) (not shown), which are in communication with the carrier block S1 and the interface block S3, are provided in substantially center regions of the COT layers B3 and B4 to extend in the longitudinal direction (Y direction in FIG. 1) of the COT layers B3 and B4.

On the right side of the transfer area R1 (R2) ("right" means the negative direction of the X-axis in FIG. 1, which holds true in the following description), there are disposed three developing units 31a, 31b and 31c as liquid process units for performing a developing step, four resist coating units 32a and 32b, and two cleaning units (SCRs) (see, FIGS. 1 and 3).

In order that the process history of each wafer W can be specified (in particular, in order that units used in the previous process steps to each wafer W can be specified), identifications are respectively assigned to the developing units 31a, 31b and 31c, and the resist coating units 32a and 32b.

As shown in FIG. 3, identifications "DEV1-1", "DEV1-2" and "DEV1-3" are respectively assigned to the developing units 31a, 31b and 31c in the DEV layer B2. Identifications "COT2-1" and "COT2-2" are respectively assigned to the resist coating units 32a in the COT layer B3, and identifications "COT3-1" and "COT3-2" are respectively assigned to the resist coating units 32b in the COT layer B4. The control part 60 stores, in the storage part thereof, data that can specify the process units used in previous process steps performed to each wafer W (to be specific, data in which the identifications of the carriers and the identifications of the units are correlated to each other, for example).

As shown in FIGS. 1 and 4, disposed on the left side of the transfer area R1 (R2) are four unit shelves U1, U2, U3 and U4 each composed of a plurality of heat treatment units stacked vertically. As specifically shown in FIG. 4, at a location corresponding to the DEV layer B2, there are stacked three heat treatment units for performing a pre-process step and a post-process step of a developing step performed by the units 31a to 31c. The developing units 31a to 31c are separated from the unit shelves U1 to U4 by the transfer area R1. By jetting a clean air to the transfer area R1 and discharging the air therefrom, suspending of particles in the transfer area R1 is restrained.

The aforementioned units for performing the pre-process step and the post-process step of the developing step include post-exposure baking units (PEBs) each for heating an exposed wafer W, and post-baking units (POSTs) each for heating a developed wafer W to dehydrate the same. Each heat treatment unit (PEB, POST, and so on) is accommodated in respective processing containers 40. Each of the unit shelves U1 to U4 include three stacked processing containers 40 located at a level corresponding to the DEV layer B2. A wafer loading and unloading port 41 is formed in a face, facing the transfer area R1, of each processing container 40.

The heat treatment units (PEBs and POSTs) are electrically connected to the control part 60, and thus heating conditions such as the heating temperature and heating time can be controlled based on control signals from the control part 60.

In order that the process history of a wafer W can be specified, identifications are assigned to the heat treatment units (PEBs and POSTs). As shown in FIG. 4, identifications "POST1-1", "POST1-2" and "POST1-3" are assigned to the heat treatment units in the unit shelf U1. Identifications "POST2-1", "POST2-2" and "POST2-3" are respectively assigned to the heat treatment units in the unit shelf U2. Identifications "PEB3-1", "PEB3-2" and "PEB3-3" are respectively assigned to the heat treatment units in the unit shelf U3. Identifications "PEB4-1", "PEB4-2" and "PEB4-3" are respectively assigned to the heat treatment units in the unit shelf U4. The control part 60 stores data, according to which heat treatment units used in the previous process to each wafer W can be specified in connection with those identifications.

The main arm A1 is disposed on the transfer area R1. The main arm A1 is configured to be capable of moving in the horizontal X and Y directions and the vertical Z direction, and of rotating about the vertical axis, such that a wafer W can be transferred among all the positions (units and stages), such as the heat treatment units in the unit shelves U1 to U4 and the developing units 31a to 31c, on which a wafer W can be placed in the DEV layer B2.

Since the main arms A1 and A2 have the same structure, only the structure of the main arm A1 will be described. As shown in FIG. 1, the main arm A1 includes an arm body 50 having two curved arm pieces 51 each for supporting the peripheral areas of the rear surface of a wafer W. These curved arm pieces 51 can independently move forward and rearward with respect to a base table, not shown. The base table is configured to be capable of rotating about the vertical axis, moving in the Y direction, and moving in the vertical direction. Thus, the curved arm pieces 51 are capable of moving in the X direction, moving in the Y direction, moving in the vertical direction, and of rotating about the vertical axis, so that a wafer W can be transferred among the units in the unit shelves U1 to U4, the transfer stage TRS1 of the unit shelf U5 disposed on the side of the carrier block S1, and the liquid process units (COTs, DEVs and SCRs). According to the commands from the control part 60, driving of the main arm A1 (A2) is controlled by a controller, not shown. In order to prevent accumulation of heat in the main arm A1 (A2) which might be caused by a heat generated by the heating units, a transfer order of a wafer W can be optionally controlled by the program.

The unit blocks B3 and B4 have substantially the same structure. The unit blocks B3 and B4 respectively include the resist coating units 32a and 32b for performing a resist-liquid coating step. In the unit shelves U1 to U4, at a level corresponding to the COT layers B3 and B4, there are disposed heating units (CLHPs) each for heating a wafer W to which a resist liquid has been coated, and hydrophobing units (ADHs) each for enhancing adhesion between a resist liquid and a wafer W. The resist coating units 32a and 32b, and the heating units (CLHPs) and the hydrophobing units (ADHs) of the unit shelves U1 to U4 are separated by the transfer area R2 (area in which the main arm A2 is horizontally moved). In the COT layers B3 and B4, a wafer W is transferred by the main arm A2 among the transfer stage TRS1 of the unit shelf U5, the resist coating units 32a and 32b, and the respective units of the unit shelves U1 to U4. The hydrophobing unit (ADH), which performs a gas process in HMDS atmosphere, may be disposed on either of the unit block B3 or B4.

In order that the process history of a wafer W can be specified, identifications are assigned to the heating units (CLHPs). As shown in FIG. 4, identifications "CLHP1-4", "CLHP1-5", "CLHP1-6" and "CLHP1-7" are respectively assigned to the heating units in the unit shelf U1. Identifications "CLHP2-4", "CLHP2-5", "CLHP2-6" and "CLHP2-7" are respectively assigned to the heating units in the unit shelf U2. Identifications "CLHP3-4", "CLHP3-5", "CLHP3-6" and "CLHP3-7" are respectively assigned to the baking units in the unit shelf U3. Identifications "CLPH4-4" and "CLHP4-5" are respectively assigned to the heating units in the unit shelf U4. Identifications "ADH4-6" and "ADH4-7" are respectively assigned to the hydrophobing units in the unit shelf U4. The control part 60 stores data, according to which heat treatment units used in the previous processes to each wafer W can be specified in connection with those identifications.

The etching block S5, which is positioned adjacent to the process block S2, is equipped with a housing 70a connected to the housing 70 of the process block S2. In the housing 70a, a plurality of (four in this embodiment) etching units 80 (dry etching apparatuses) are stacked. In the housing 70a, there are further disposed the transfer arm D for loading and unloading a wafer W to and from the respective etching units 80, and the transfer stage TRS2. The transfer arm D is capable of moving in the horizontal X and Y direction and the vertical direction and of rotating, such that a wafer W can be transferred between the transfer stage TRS1 of the unit shelf U5 in the process block S2 and the transfer stage TRS2 in the etching block S5. In this embodiment, the etching units 80 are configured to control the etch rate by adjusting etching process conditions, such as the frequency and voltage of high-frequency waves applied in a vacuum atmosphere, and the process gas pressure. As shown in FIG. 4, identifications "ET-1", "ET-2", "ET-3" and "ET-4" are respectively assigned to the etching units 80. The control part 60 stores data, according to which etching units used in the previous processes to each wafer W can be specified in connection with those identifications.

The housing 70a of the etching block S5 has a shield for blocking electromagnetic waves. Thus, during a dry etching process, there is no possibility that electromagnetic waves generated by the etching unit 80 leaks outside and gives thereto an adverse effect. As such a shield, a shielding plate made of a conductive metal or a synthetic resin may be used. In this embodiment, a shielding plate 81 made of aluminum alloy is used to constitute the housing 70a.

The measuring block S6, which is positioned between the carrier block S1 and the etching block S5, is equipped with a housing 70b connected to the carrier block S1 and the housing 70a of the etching block S5. In the housing 70b, there are disposed a line width measuring device 90 as a device for measuring a process result, the transfer arm E for loading and unloading a wafer W to and from the line width measuring device 90, and the transfer stage TRS3. The transfer arm E is configured to be capable of moving in the horizontal X and Y direction and the vertical direction and of rotating, such that a wafer W can be transferred among the transfer stage TRS3 in the measuring block S6, the transfer stage TRS2 in the etching block S5, and the line width measuring device 90.

Figure 5:
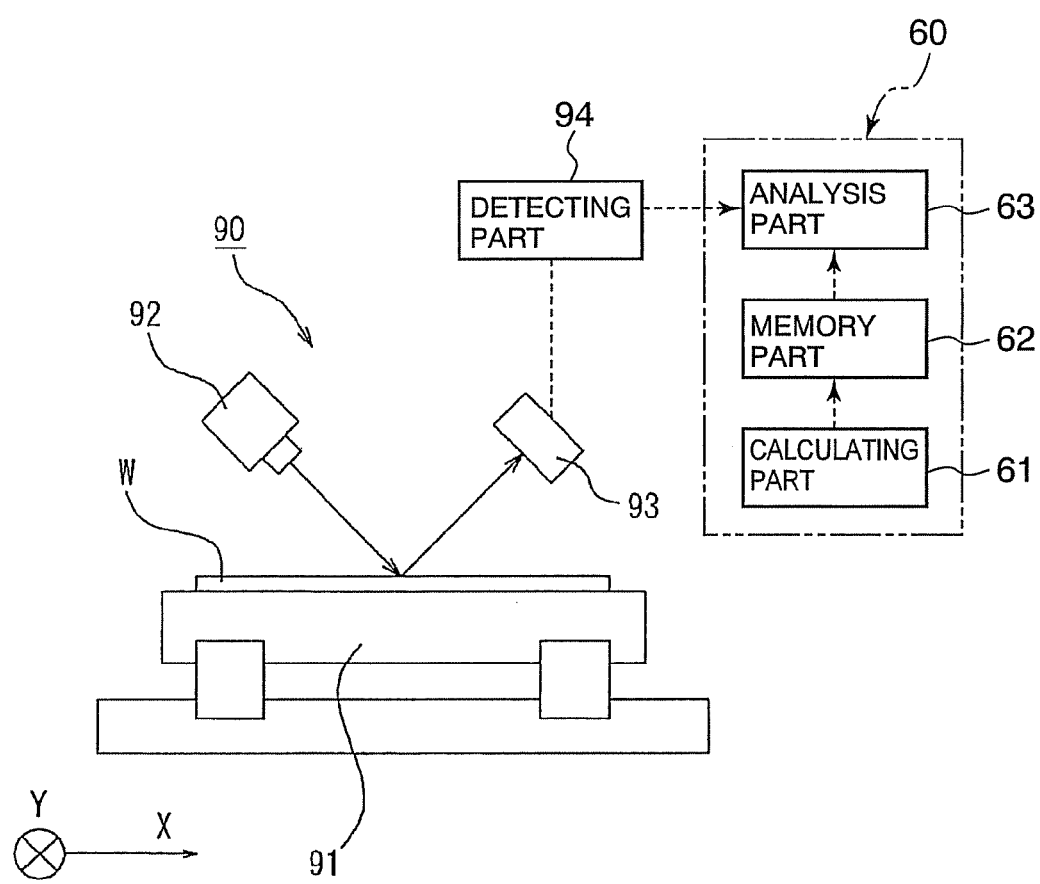
FIG. 5 is a schematic side view showing a line-width measuring device.

As shown in FIG. 5, the line width measuring device 90 has a table 91 on which a wafer W can be horizontally placed. The table 91 is structured as an X-Y stage, and thus is capable of moving in the horizontal X and Y directions. Disposed above the table 91 are a light emitting part 92 that obliquely emits a light beam to a wafer W placed on the table 91, and a light receiving part 93 that receives a light beam that has been emitted from the light emitting part 92 and reflected from the wafer W. Reflected light information detected by the light receiving part 93 is outputted to a detecting part 94. Based on the reflected light information, the detecting part 94 can measure the light intensity distribution of the reflected light reflected by the pattern formed on the wafer W. The line width measuring device can also detect impurities and particles adhering on the wafer W, in addition to the line width of the pattern.

The information from the detecting part 94 is transmitted to the control part 60, and the control part 60 processes the information for measuring the line width. The control part 60 has a calculation part 61, a memory part 62, and an analysis part 63. The calculation part 61 can calculate the light intensity distributions of the reflected light beams reflected from a plurality of virtual patterns having different line widths, based on known information such as the optical constant of the resist film, the pattern shape and the pattern structure. The memory part 62 can store the light intensity distributions of the respective virtual patterns which have been calculated by the calculation part 61, and can create a library of the light intensity distributions.

The light intensity distribution of the actual pattern on the wafer W, which has been measured by the measuring part 94, is outputted to the analysis part 63. The analysis part 63 compares the light intensity distribution of the actual pattern which has been outputted from the detecting part 94, and the light intensity distributions of the virtual patterns which are stored in the library of the memory part 62. Then, the analysis part 63 selects a virtual pattern whose light intensity distribution conforms to that of the actual pattern, and determines the line width on the supposition that line width of the selected virtual pattern is the line width of the actual pattern.

The information about the line width, which has been measured as described above, is transmitted to the exposure apparatus S4, the post-exposure baking unit (PEB) and the etching unit 80. The exposure apparatus S4 has an exposure control part (not shown). The exposure apparatus S4 is controlled by the exposure control part based on various preset exposure condition parameters such as the exposure position on the wafer W, the exposure amount and the exposure focal point of the optical system.

The control signals from the control part 60 are transmitted to the exposure apparatus S4, the post-exposure baking unit (PEB) and the etching unit 80. Thus, in the second or more lithography process, based on the information about the line width of the pattern, it is possible to correct exposure conditions such as the exposure position, the exposure amount and the exposure focal point in the exposure step, to correct heating conditions such as the heating temperature and the heating time in the post-exposure baking step, and to correct the etch rate by correcting etching process conditions such as the frequency and voltage of high-frequency waves to be applied and the process gas pressure in the etching step.

As shown in FIG. 1, in an area of the process block S2 adjacent to the interface block S3, a unit shelf U6 is disposed at a position to which the main arm A1 can access. The unit shelf U6 has the transfer stage TRS4 at which a wafer W can be transferred to and from the main arm A1 of the DEV layer B2, and another transfer stage (not shown) having a cooling function. As shown in FIGS. 1 and 4, two edge exposure units (WEE) are disposed in an area, adjacent to the interface block S3, of the process block S2.

The exposure apparatus S4 is connected to the rear part of the unit shelf U6 in the process block S2 through the interface block S3. The interface block S3 has an interface arm F for transferring a wafer W between the respective units and stages of the unit shelf U6 of the DEV layer B2 in the process block S2 and the exposure apparatus S4. The interface arm F serves as means for transferring a wafer W, which is positioned between the process block S2 and the exposure apparatus S4. The interface arm F is configured to be capable of moving in the horizontal X and Y directions and the vertical Z direction, and of rotating about the vertical axis, such that a wafer W can be transferred to and from the transfer stage TRS4 and so on of the unit shelf U6.

Figure 6:
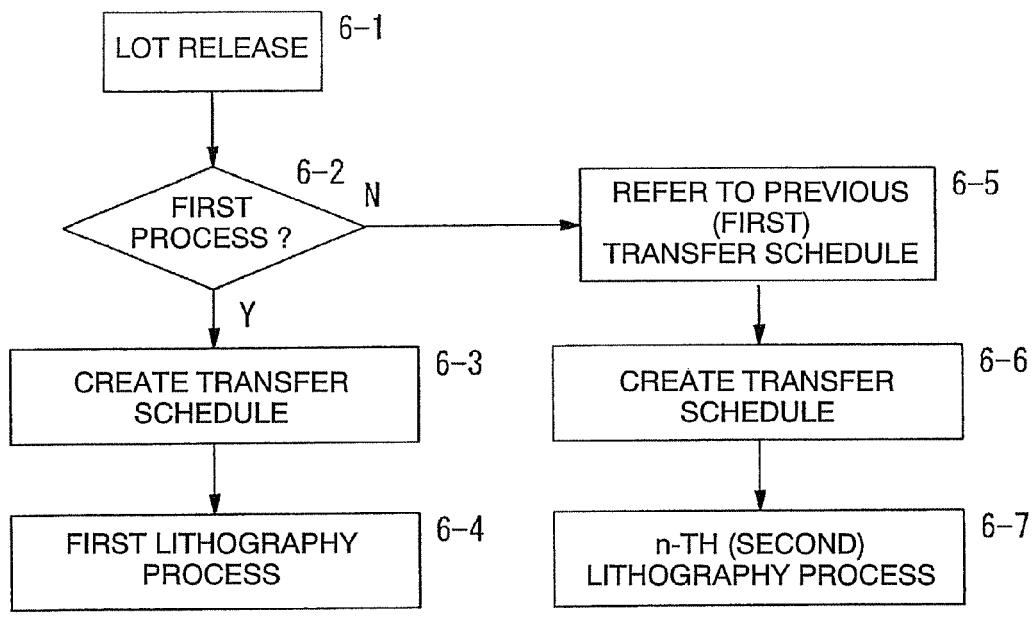
FIG. 6 is a flowchart showing processes based on a substrate transfer schedule of a substrate processing method according to the present invention.
Figure 7:
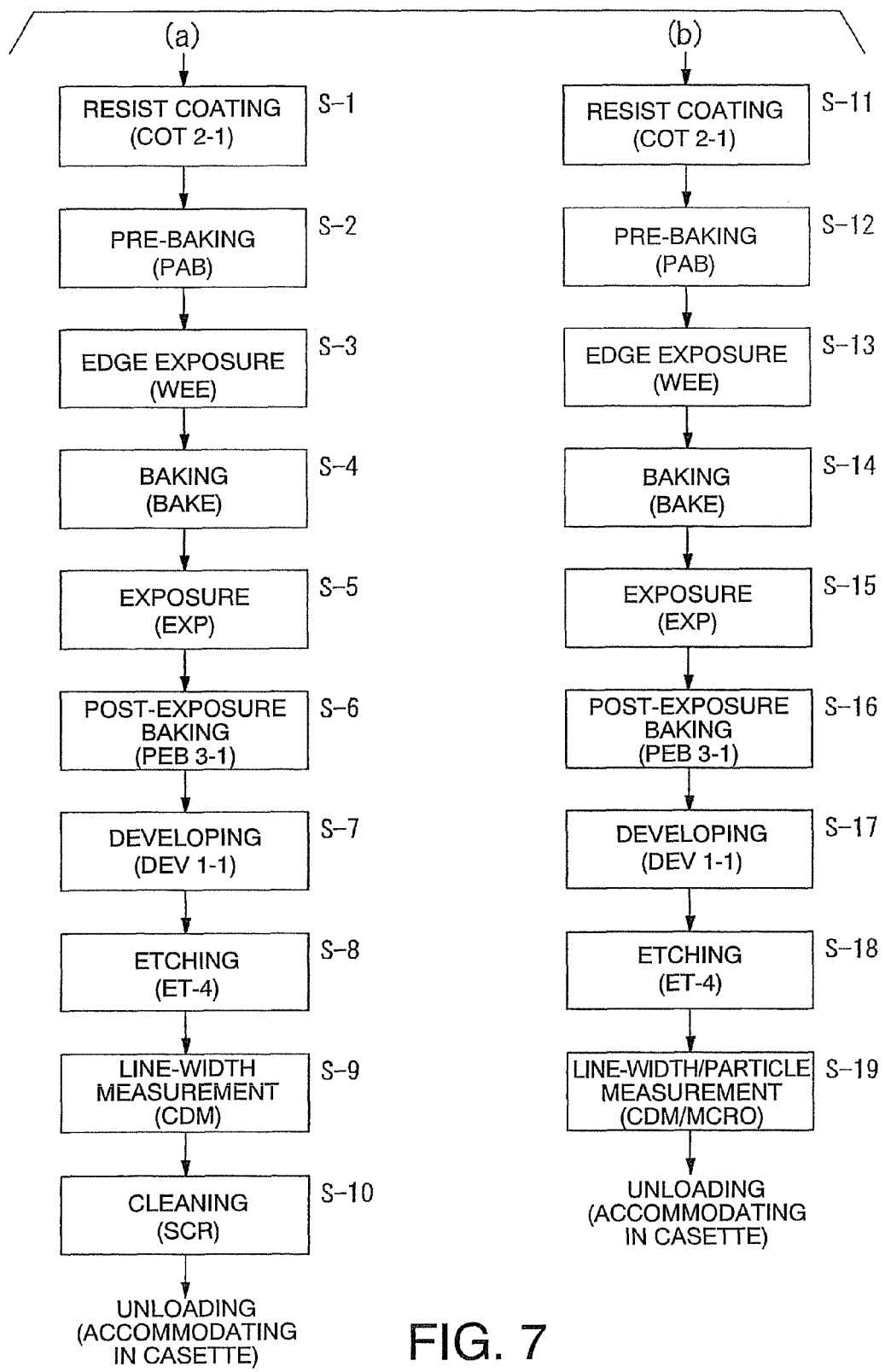
FIG. 7 is a flowchart showing a lithography process and an etching process of a substrate performed by the substrate processing method according to the present invention.

Next, a process to a wafer W performed by the above coating and developing system will be described with reference to the flowcharts shown in FIGS. 6 and 7.

At first, a carrier 20 accommodating wafers W to be processed is placed on the table 21 of the carrier block S1 (Lot Release: Step 6-1). Under this state, the identification attached to the carrier 20 is detected by the detecting means 23, and the detection signal is transmitted to the control part 60. Based on the identification, the control part 60 judges whether the process (lithography process and etching process) to be performed to the wafers W in the carrier 20 from now is the first process to the wafers W, or the second or more process to the wafers W (Step 6-2). In this embodiment, the control part 60 manages the process history of each wafer by using the identification attached to the carrier 20.

If the step 6-2 judges that the process is the first process (Yes), process units for respective steps used in the first process are determined, and a transfer schedule of the wafers W is created (Step 6-3). In view of the feature of the present invention, since any process units can be used in the "first process", the process units to be used may be selected randomly, or may be selected in consideration of the throughput of the overall system. In addition, it is possible to use one transfer schedule that has been prepared in advance, or one transfer schedule selected from a plurality of transfer schedules that have been prepared in advance (in the latter case, process units to be used have been determined in advance by the selected transfer schedule).

Based on the determined transfer schedule, under the control of the control part 60, the first lithography process is performed to the wafers W in the carrier 20 (Step 6-4). Herebelow, the procedure of the process steps from the resist coating step in the first lithography process is described with reference to FIG. 7(a).

Each wafer W is taken out from the carrier 20 by the transfer arm C, and is loaded into the hydrophobing unit ADH through any suitable route. After the wafer W has been subjected to the hydrophobing process in the hydrophobing unit ADH, the wafer W is temporarily stored in any suitable storage location provided in the unit shelf U5.

Thereafter, the wafer W is taken out from the unit shelf U5 by the main arm A2, and is transferred to one of the resist coating units 32a and 32b, e.g., COT2-1. Therein, a resist coating step (Step S-1) is performed to the wafer W, so that a resist film is formed on the wafer W. Then, the wafer W is transferred by the main arm A2 to the heating unit (CLHP), in which pre-baking step (PAB) (Step S-2) is performed, so that the solvent contained in the resist film evaporates therefrom. Subsequently, the wafer W is transferred to the peripheral exposure unit (WEE), in which an edge exposure step (Step S-3) and then a baking step (BAKE) (Step S-4) are performed. Following thereto, the wafer W is transferred by the interface arm F to the exposure apparatus S4, in which an exposure step (Step S-5) to the wafers W is performed.

The exposed wafer W is transferred by the interface arm F to the transfer stage TRS4 of the unit shelf U6, and is received therefrom by the main arm A1 of the DEV layer B2. The wafer W is transferred to the post-exposure heating unit (e.g., PEB3-1) of the DEV layer B2, in which a post-exposure heating step (Step S-6) is performed. After that, the wafer W is transferred by the main arm A1 to the cooling plate (not shown) in the unit shelf U6, in which the temperature of the wafer W is adjusted to a predetermined temperature. Then, the wafer W are taken out from the unit shelf U6 by the main arm A1, and are transferred to one of the developing units 31a to 31c, e.g., DEV1-1. Therein, a developing step (coating a developer with the wafer W) (Step S-7) is performed. Then, the wafer W is transferred to the post-baking unit (POST) by the main arm A1, and moisture on the wafer W is removed.

The wafer W, which has been subjected to the developing step, is transferred to the transfer stage TRS1 in the unit shelf U5, and is received therefrom by the transfer arm D of the etching block S5. Then, the wafer W is transferred to one of the etching units 80, e.g., ET-4, of the etching block S5, in which an etching step (etching process) (step S-8) is performed to the wafer W by using the developed pattern as a mask.

The wafer W, which has been subjected to the etching process, is taken out from the etching unit 80 by the transfer arm D, and is transferred to the transfer stage TRS2 of the etching block S5. The wafer W is then received from the transfer stage TRS2 by the transfer arm E of the measuring block S6, and are transferred to the line width measuring device 90 of the measuring block S6. Then, the line width of the pattern formed on the wafer W is measured therein (Step S-9). Measurement information about the line width is transmitted to the control part 60, and is stored in the control part 60.

Figure 8:
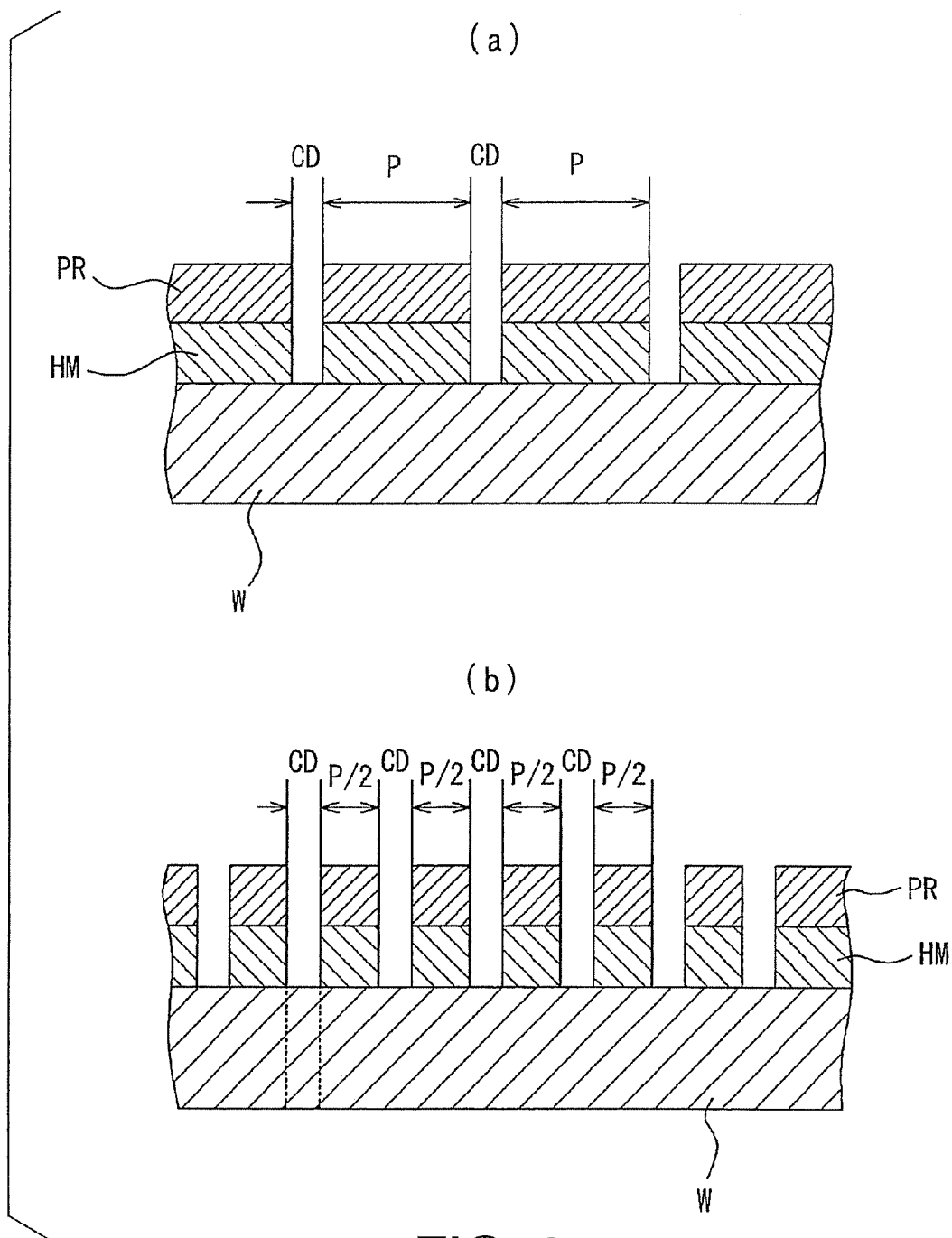
FIG. 8($a$) is an enlarged sectional view showing a first pattern formation and FIG. 8($b$) is an enlarged sectional view showing a second pattern formation.

The wafer W whose line width has been measured is taken out from the line width measuring device 90 by the transfer arm E, and then is sequentially transferred to the transfer stage TRS2 of the etching block S5, the transfer arm D, and the transfer stage TRS1 of the process block S2. Thereafter, the wafer W on the stage TRS1 is received by the main arm A2 of the process block S2, and is transferred to the cleaning unit (SCR). Therein, a cleaning step (Step S-10) for cleaning the wafer W is performed. In this manner, a series of process steps of the lithography process and the etching process are completed. As shown in FIG. 8(a), a pattern having pitch P is formed on the surface of the wafer W by means of the above processes. A value of the pitch P is set to be not less than a critical value which assures that a resist PR does not collapse in the first lithography process. In FIG. 8, the reference character CD depicts the line width, and the reference character HM depicts a hard mask. Actually, after the wafer W has become the state shown in FIG. 8(a), the resist PR is removed by a not-shown resist ashing unit or a resist strip unit disposed in the etching block S5.

The wafers W which have been subjected to the first lithography process and etching process are transferred into the vacant carrier 20 placed on the table 21 of the carrier block S1.

Returning again to FIG. 6, if the step 6-2 judges "the second or more process (No)", (hereinafter the process is supposed to be the "second" process for simplicity of the description), the control part 60 reads out the transfer schedule (i.e., transfer history) which was applied to the process (i.e., the first lithography process and etching process) performed to the wafers W in the carrier 20 most recently. Namely, the control part 60 specifies identification of process units used in the respective steps of the first lithography process and etching process (Step 6-5).

Then, the control part 60 determines process units to be used in respective steps of the second lithography process and etching process to be performed from now, based on the identifications of the process units used in the first lithography process and etching process. As the resist coating unit for performing the resist coating step, one resist coating unit is selected from the resist coating unit group consisting of the four resist coating units COT2-1, COT2-2, COT3-1 and COT3-2 of the same specification. Similarly, for each of the other steps (the post-exposure baking step, the developing process, and so on) of the lithography process, one process unit is from the unit group consisting of a plurality of process units of the same specification. Further, one etching unit is selected for the etching process from the etching unit group consisting the four etching units ET-1, ET-2, ET3 and ET-4 of the same specification. Thereafter, based on the selected process units, the control part 60 creates a transfer schedule, according to which the second lithography process and etching process are performed.

The process steps of the lithography process and the etching process include some steps (specifically, the resist coating step, the post-exposure baking step, the developing step, and the etching step are illustrated) in which slight change of process conditions, which may be caused by individual differences between the process units, may considerably affect the process result. Thus, regarding the process units for performing such steps in the multi-patterning, it is preferable that process units to be used in the second process (patterning) are the same as those used in the first process (patterning). In this embodiment, process units used in the resist coating step, the post-exposure baking step, the developing step and the etching step are the same as those used in the first process.

Based on the selected process units, the control part 60 creates a transfer schedule for the second lithography process and etching process (Step 6-6). At this time, process units for performing steps other than the resist coating step, the post-exposure baking step, the developing step and the etching step, may be selected in consideration of more effective transfer operation and higher throughput of the overall system.

Then, based on the thus created transfer schedule, the second lithography process and the second etching process are performed (Step 6-7). Herebelow, the second lithography process is described with reference to FIG. 7(b).

From the carrier holding wafers W that have been subjected to the first lithography process and etching process, each wafer W is unloaded, is transferred through the same route as that of the first process, and is loaded into the resist coating unit COT2-1 that was used in the first lithography process to the wafer W. Then, the resist coating step (Step S-11) is performed to the wafer W so that a resist film is formed. Since the second resist coating step is performed by using the resist coating unit COT2-1 which was used in the first resist coating step, it is possible to minimize the difference between the film thickness of the resist formed by the second resist coating step and the film thickness of the resist formed by the first resist coating step.

Then, similarly to the first lithography process, the pre-baking step (PAB) (Step S-12), the edge exposure step (WEE) (Step S-13), the baking step (BAKE) (Step S-14) and the exposure step (EXP) (Step S-16) are sequentially performed to each wafer W on which the resist films have been formed. Then, the post-exposure baking step (step S-16) is performed to the wafer W by using the post-exposure baking unit PEB3-1 which was used in the first post-exposure baking step. Since the second post-exposure baking step is performed by using the post-exposure baking unit PEB3-1 which was used in the first post-exposure baking step, it is possible to, when a chemically amplified resist is used, in particular, minimize the difference between process conditions such as process time and process temperature, which affect the oxide catalytic reaction, in the first and the second post-exposure baking steps.

Each wafer W, which has been subjected to the post-exposure baking step, is transferred to the developing unit DEV1-1 which was used in the first lithography process, and the developing process (Step S-17) is performed to the wafers W. Since the second developing step is performed by using the developing unit DEV1-1 which was used in the first developing step, it is possible to minimize differences between the developing time, and supply amounts and concentrations of the developer, in the first and the second developing processes. After the developing step, the wafers W are post-baked.

The developed wafer W is transferred to the etching unit ET-4 which was used in the first etching process (etching step), and the etching step (Step S-18) is performed to the wafer W. Thus, as shown in FIG. 8(b), another pattern having pitch P is formed on the wafer W, in addition to the pattern having pitch P that has been formed by the first lithography process and etching process, whereby a pattern having pitch P/2 can be generally formed. As can be understood by those skilled in the art, FIG. 8(b) is a schematic view briefly showing a double patterning, and holes formed by the first patterning are actually filled with the resist, upon completion of the step S-18. Since the second etching process is performed by using the etching unit ET-4 which was used in the first etching process, it is possible to minimize the difference between etch amounts in the first and the second developing steps. Actually, after the step S-18, the resist PR is removed by the not-shown resist ashing unit or resist strip unit disposed in the etching block S5.

The measurement information about the line width of the pattern measured after the first etching process by the line width measuring device 90 is transmitted form the control part 60 to the exposure apparatus S4, the baking unit (PEB) and the etching unit 80, whereby, in the second or more lithography process, it is possible to correct, based on the above measured information, exposure conditions such as the exposure position, the exposure amount, and the exposure focal point in the exposure step, to correct heating conditions such as the heating temperature and the heating time in the post-exposure baking step, and to correct etching conditions such as the frequency and voltage of the high-frequency waves and the process gas temperature in the etching step. All the aforementioned corrections may be performed, or only some of the corrections may be performed. Due to these corrections, a multi(double)-patterning having a higher precision can be performed.

The wafer W, which has been subjected to the second lithography process and etching process, is transferred to the line width measuring device 90 of the measuring block S6. Therein, the line width of the pattern is measured, and impurities and particles adhering to the surface of the wafer W are measured (CDM/MCRO) (step S-19). The measurement information is also transmitted to the control part 60, whereby it is possible to grasp the shape and pitch of the pattern that has been actually formed on the wafer W, and conditions of the impurities and the particles adhering to the wafers W.

The wafers W, which have been subjected to the second lithography process and etching process, are transferred by the transfer arm C into the vacant carrier 20 placed on the carrier block S1. In this manner, a series of process steps of the double (multi)-patterning are completed.

The present invention is not limited to a method in which the lithography process and the etching process are respectively performed twice, but can be applied to a method in which the lithography process and the etching process are respectively performed three times or more. In this case, process units to be used in an n-th process can be determined based on process units which were used in an (n−1)-th process, similarly to the above way. Also in this case, the same effects as above can be obtained.

In the first embodiment, the lithography process and the etching process are performed in the same system, by using the resist coating and developing system in which the etching units 80 are incorporated. However, the present invention is not limited thereto. Namely, the etching process succeeding the lithography process may be performed by using etching units (etching apparatus) separated from the resist coating and developing system.

Figure 9:
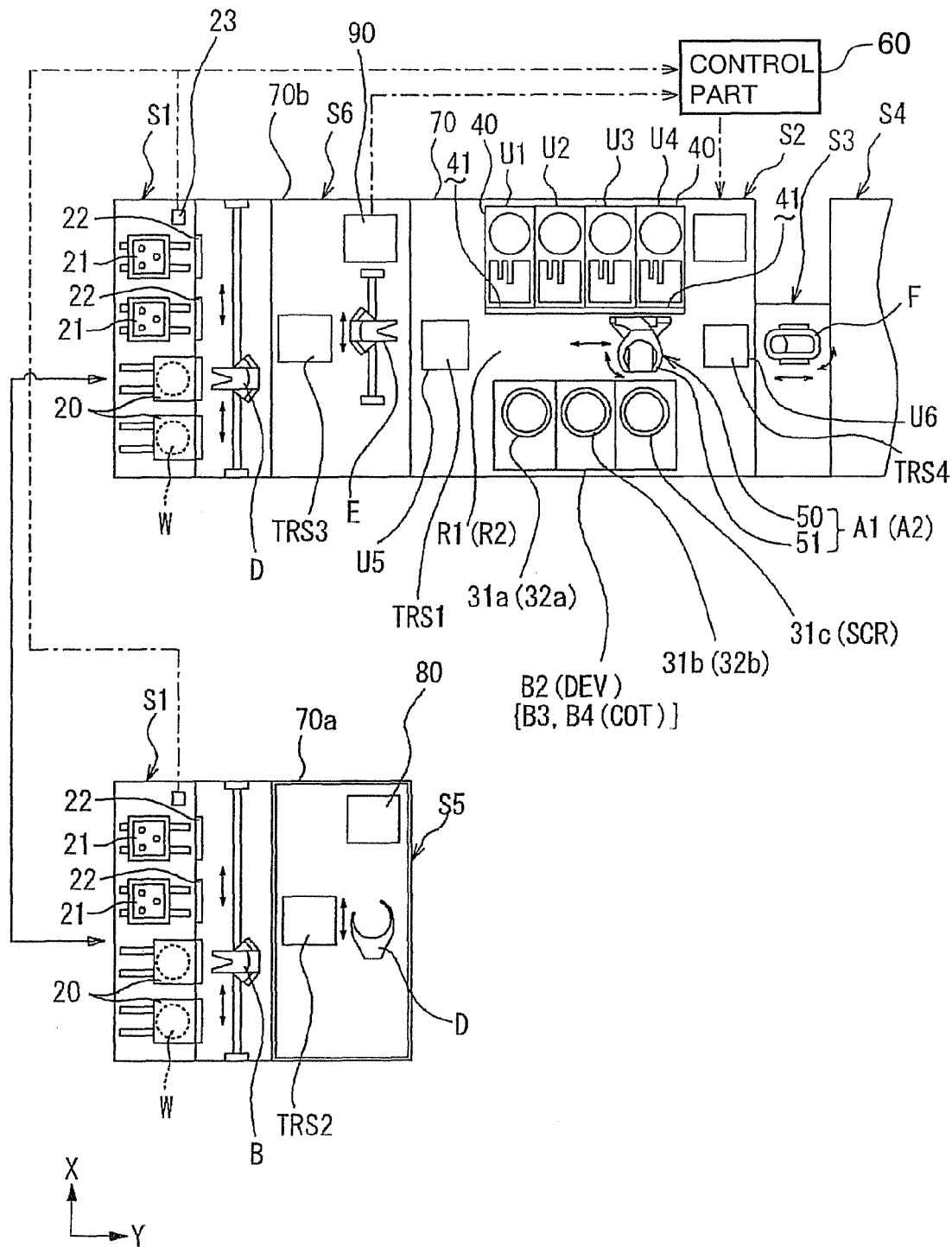
FIG. 9 is a schematic plan view of a second embodiment of a resist coating and developing system of the substrate processing system according to the present invention.

As shown in FIG. 9, a resist coating and developing system in a second embodiment is constituted by removing the etching block S5 from the resist coating and developing system in the first embodiment. An etching apparatus is located at a position separated from the resist coating developing system. The etching apparatus has a structure substantially equivalent to the combination of the carrier block S1 and the etching block S5 of the resist coating and developing system in the first embodiment. In the second embodiment, the same component parts as those of the first embodiment are shown by the same reference numbers, and detailed description thereof is omitted.

In the second embodiment, as shown by the solid line in FIG. 9, wafers W can be transferred between the resist coating and developing system and the etching apparatus. In this case, a plurality of wafers W accommodated in a carrier 20 can be transferred at once. Alternatively, wafers W may be transferred one by one.

Figure 10:
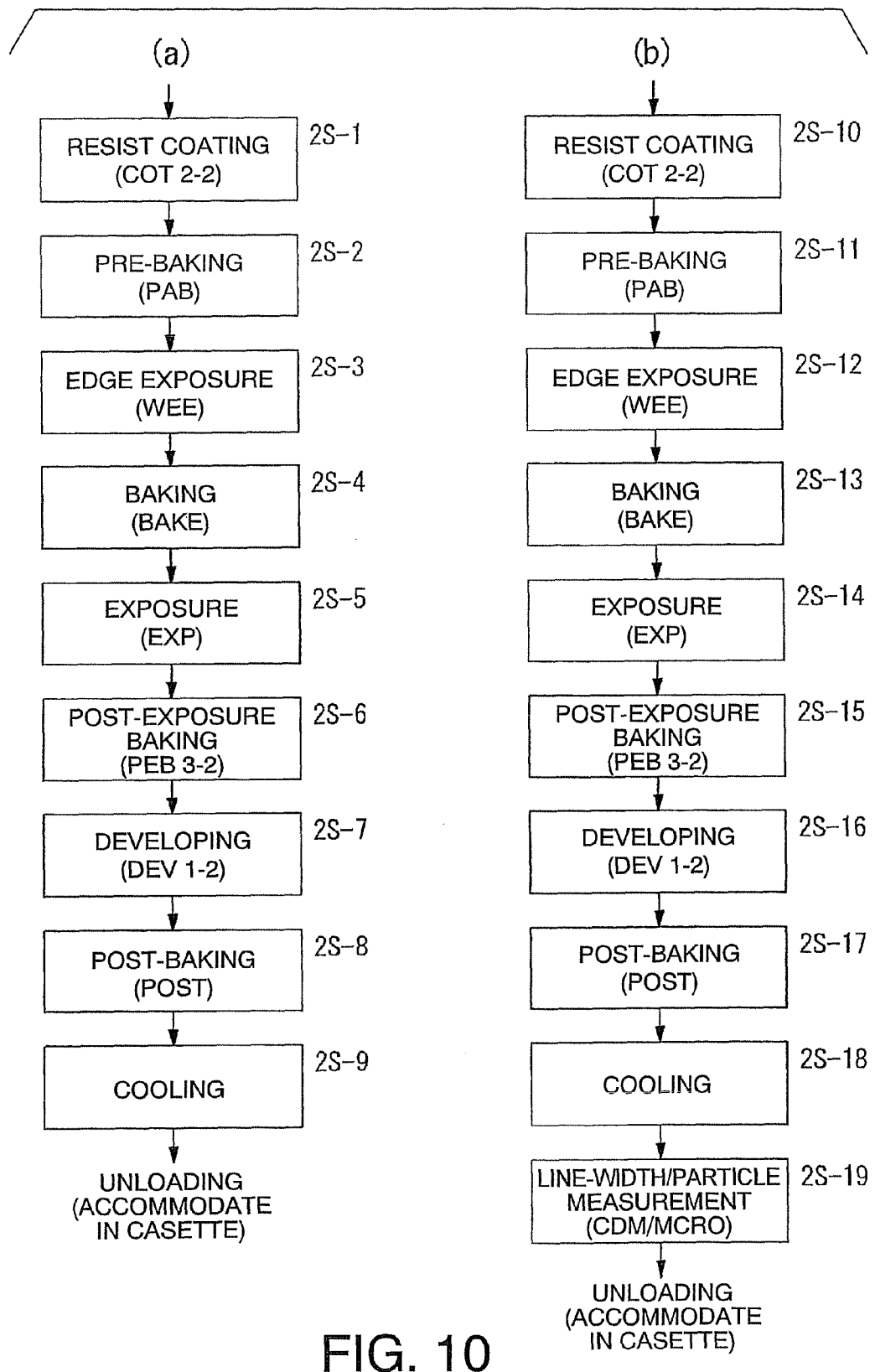
FIG. 10 is a flowchart showing a lithography process and an etching process in a second embodiment of the substrate processing method.

Next, a substrate processing method in the second embodiment will be described with reference to the flowcharts shown in FIGS. 6 and 10.

At first, a carrier 20 accommodating wafers W to be processed is placed on a table 21 of a carrier block S1 (Lot Release: Step 6-1). Under this state, the identification attached to the carrier 20 is detected by a detecting means 23, and the detection signal is transmitted to a control part 60. Based on the identification, the control part 60 judges whether the process (lithography process and etching process) to be performed to the wafers W in the carrier 20 from now is the first process to the wafers W, or the second or more process to the wafers W (Step 6-2). When the process to be performed from now is judged as "first time", the program proceeds to a step 6-3. Then, the first lithography process (Step 6-4) is performed, based on a transfer schedule which is created for the first lithography process at this time, or a transfer schedule which has been created beforehand. Herebelow, the procedure of the process steps from the resist coating step of the first lithography process is described with reference to FIG. 10(a).

Each wafer W, which has been subjected to the hydrophobing process and is temporarily stored in the unit shelf U5, is taken out from the unit shelf U5 by the main arm A2. The wafer W is then transferred to one of the resist coating units 32a 32b, e.g., COT2-2, in which a resist film is formed (Step 2S-1). The wafer W on which the resist film has been formed is transferred by the main arm A2 to the baking unit (CLHP), in which the pre-baking step (PAB) (Step 2S-2) is performed for evaporating the solvent from the resist film. Thereafter, the wafer W is transferred to the edge exposure unit (WEE) and is subjected to the edge exposure step (Step 2S-3) and the heating step (Step 2S-4). Then, the wafer W is transferred by the interface arm F to the exposure apparatus S4, in which the exposure step (Step 2S-5) is performed.

The wafer W, which has been subjected to the exposure step, is transferred by the interface arm F to the transfer stage TRS4 of the unit shelf U6, in order for the wafer W to be transferred to the DEV layer B2. The wafer W on the stage TRS4 is received by the main arm A1 of the DEV layer B2. The wafer W is firstly subjected to the post-exposure baking step (Step 2S-6) in the post-exposure baking unit (e.g., PEB3-2) of the DEV layer B2. Then, the wafer W is transferred to the cooling plate (not shown) of the unit shelf U6 by the main arm A1, and the temperature of the wafer W is adjusted to a predetermined temperature. Thereafter, the wafer W is taken out from the unit shelf U6 by the main arm A1 and is transferred to one of developing units 31a to 31c, e.g., DEV1-2. Therein, the wafer W is coated with a developer (Step 2S-7). After that, the wafer W is transferred by the main arm A1 to the post-baking unit (POST), in which the wafer W is heated and then cooled (Steps 2S-8 and 2S-9).

The wafers W, which have been subjected to the developing step, are transferred into the vacant carrier 20 placed on the table 21 of the carrier block S1, and are unloaded from the resist coating and developing system.

The wafers W, which have been subjected to the first lithography process by the resist coating and developing system, are transferred to the etching apparatus. The wafers W are subjected to the etching process therein by using the developed pattern as a mask. Thereafter, the wafers W are transferred into the carrier 20, and are loaded again into the carrier block S1 of the resist coating and developing system.

When the carrier 20 accommodating the wafers W which have been subjected to the first lithography process and etching process is placed on the stage 21 of the carrier block S1, the identification attached to the carrier 20 is detected by the detecting means 23. In this case, the wafers W are going to be subjected to the second lithography process from now, and the control part 60 recognizes the fact. Then, the control part 60 refers to the transfer history (history of the units used in the respective steps) in the previous (first) lithography process (Step 6-5). After the previous transfer history has been recognized, the program proceeds to a step 6-6. Namely, the control part 60 determines process units to be used in the second lithography process by the same manner as that of the aforementioned first embodiment, and creates a transfer schedule (Step 6-6). Based on the transfer schedule, under the control of the control part 60, the second lithography process (step 6-7) is performed. Herebelow, the procedure succeeding the resist coating step of the second lithography process is described with reference to FIG. 10(b).

Similarly to the first process, when the carrier 20 accommodating the wafers W which have been subjected to the first lithography process and etching process is loaded, the resist coating step (step 2S-10) is performed to each wafer W by using the resist coating unit COT2-2 which was used in the first process, so that resist films are formed. Since the resist coating step is performed by using the resist coating unit COT2-2 which was used in the first process, change in the resist film thicknesses formed by the second lithography process can be prevented.

Similarly to the first lithography process, there are performed the pre-baking step (PAB) (step 2S-11), the edge exposure step (WEE) (step 2S-12), the baking step (BAKE) (step 2A-13) and the exposure step (EXP) (step 2S-14), in that order, to the wafer W on which the resist films have been formed. Thereafter, the post-exposure baking step (step 2S-15) is performed to the wafer W by using the post-exposure baking unit PEB3-2 which was used in the first lithography process. Since the post-exposure baking step is performed by using the post-exposure baking unit PEB3-2 which was used in the first lithography process, it is possible to minimize, when a chemically amplified resist is used, for example, the difference between process conditions such as the process time and the process temperature, which affect an oxide catalytic reaction, in the first and the second post-exposure baking steps.

After the post-exposure baking step, the wafers W are transferred to the developing unit DEV1-2 which was used in the first process, where the developing process (step 2S-16) to the wafers W is performed. Since the developing step is performed by using the developing unit DEV1-2 which was used in the first lithography process, it is possible to make constant developing conditions such as developing periods, and supply amounts and concentrations of developer, in the first and the second developing steps.

The wafer W, which has been subjected to the developing process, is then transferred by the main arm A1 to the post-baking unit (POST). The wafers W are baked and cooled therein (Step 2S-17 and 2S-18). Thereafter, the wafer W is transferred to the line width measuring device 90 of the measuring block S6. Therein, the line width of the pattern is measured, and impurities and particles adhering to the surfaces of the wafers W are also measured (CDM/MCRO) (Step 2S-19). The measurement information is transmitted to the control part 60, whereby it is possible to recognize the shape and pitch of the pattern that has been actually formed on the wafer W, and conditions of the impurities and the particles adhering to the wafer W.

The wafers W, which have been subjected to the second lithography process (process) in the above manner, are transferred by a transfer arm C into the vacant carrier 20 placed on the carrier block S1. Thus, the second lithography process is completed.

The carrier 20 accommodating the wafers W, which have been subjected to the second lithography process, is transferred to the etching apparatus, and an etching process is performed by using the resist mask which has been formed by the second lithography process. Since the pattern is additionally formed in interspaces of the pattern having pitch P, which has been formed by the first lithography process, a pattern having pitch P/2 can be generally formed. In the second etching process, it is possible to make equal etch amounts in the first and the second etching processes by using the etching unit (e.g., ET-4) which was used in the first etching process.

The wafers W, which have been subjected to the second etching process, are transferred into the carrier 20, and a series of processes are completed.

In the above embodiments, an anti-reflection film is not formed on a wafer W. However, in a case where an anti-reflection film is formed on a downside and/or upside of the resist film, the substrate processing method (system) according to the present invention can be also employed.

The invention claimed is:

1. A substrate processing method comprising a lithography process and an etching process, each of the processes is performed to one substrate at least twice, wherein the lithography process includes a plurality of steps for forming a mask having a predetermined pattern on the substrate, wherein the etching process etches the substrate by using the mask formed by the lithography process, and wherein said substrate processing method is performed by using a substrate processing system having a plurality of process unit groups respectively assigned to said plurality of process steps, and each of the process unit groups includes a plurality of process units of a same type, said method further comprising the steps of:

judging whether a lithography process to be performed to a substrate from now is a first lithography process to the substrate, or a second or more lithography process to the substrate; and determining process units to be used in the lithography process to be performed from now, by selecting one process unit from each of the process unit groups in such a way that at least one process unit to be used in the lithography process to be performed to the substrate from now is identical to a process unit used in a lithography process performed to the substrate most recently, if the judging step judges that the lithography process to be performed to the substrate from now is a second or more lithography process to the substrate.

2. The substrate processing method according to claim 1, wherein:

the substrate processing system has a plurality of etching units for performing the etching process;

in the judging step, it is also judged whether an etching process to be performed to a substrate from now is a first etching process to the substrate, or a second or more etching process to the substrate; and if the judging step judges that the etching process to be performed to the substrate from now is a second or more etching process to the substrate, the determining step selects an etching unit used in an etching process performed to the substrate most recently, as an etching unit to be used in the etching process to be performed to the substrate from now.

3. The substrate processing method according to claim 1, wherein:

the plurality of process steps include a resist coating step, a post-exposure baking step and a developing step; and if the judging step judges that the lithography process to be performed to the substrate from now is a second or more lithography process to the substrate, the determining step selects process units to be used in the lithography process to be performed to the substrate from now in such a manner that at least one of a process unit for performing the resist coating step, a process unit for performing the post-exposure baking step and a process unit for performing the developing step is the same as a process unit used in a lithography process performed to the substrate most recently.

4. The substrate processing method according to claim 3, wherein:

if the judging step judges that the lithography process to be performed to the substrate from now is a second or more lithography process to the substrate, the determining step selects process units to be used in the lithography process to be performed to the substrate from now in such a manner that a process unit for performing the resist coating step, a process unit for performing the post-exposure baking step and a process unit for performing the developing step are the same as those used in a lithography process performed to the substrate most recently.

5. The substrate processing method according to claim 1, wherein the second or more lithography process forms a pattern in interspaces of a pattern formed in a lithography process performed most recently.

6. The substrate processing method according to claim 2, wherein:

the plurality of process steps include a resist coating step, a post-exposure baking step and a developing step; and if the judging step judges that the lithography process to be performed to the substrate from now is a second or more lithography process to the substrate, the determining step selects process units to be used in the lithography process to be performed to the substrate from now in such a manner that at least one of a process unit for performing the resist coating step, a process unit for performing the post-exposure baking step and a process unit for performing the developing step is the same as a process unit used in a lithography process performed to the substrate most recently.

7. The substrate processing method according to claim 6, wherein:
if the judging step judges that the lithography process to be performed to the substrate from now is a second or more lithography process to the substrate, the determining step selects process units to be used in the lithography process to be performed to the substrate from now in such a manner that a process unit for performing the resist coating step, a process unit for performing the post-exposure baking step and a process unit for performing the developing step are the same as those used in a lithography process performed to the substrate most recently.

8. The substrate processing method according to claim 2, wherein the second or more lithography process forms a pattern in interspaces of a pattern formed in a lithography process performed most recently.

9. A substrate processing system comprising:
a substrate loading and unloading part at which a substrate is loaded and unloaded to and from said substrate processing system;
a coating and developing part, which includes a process unit group consisting of a plurality of resist coating units each having a substantially identical structure, a process unit group consisting of a plurality of post-exposure baking units each having a substantially identical structure and a process unit group consisting of a plurality of developing units each having a substantially identical structure, and which is thus configured to be capable of performing a plurality of steps of a lithography process except for an exposure step;
an interface part provided to transfer a substrate between an exposure apparatus and the coating and developing part;
substrate transfer means provided to transfer a substrate among the substrate loading and unloading part, the coating and developing part and the interface part, and to transfer a substrate in the coating and developing part; and
a control part configured to control at least the plurality of process units and the substrate transfer means;
wherein the control part includes:
means for judging whether a lithography process to be performed to a substrate from now is a first lithography process to the substrate, or a second or more lithography process to the substrate; and
means for determining process units to be used in the lithography process to be performed from now, by selecting one process unit from each of the process unit groups in such a way that at least one process unit to be used in the lithography process to be performed to the substrate from now is identical to a process unit used in a lithography process performed to the substrate most recently, if the judging means judges that the lithography process to be performed to the substrate from now is a second or more lithography process to the substrate.

10. The substrate processing system according to claim 9, further comprising an etch processing part having an etching apparatus, which includes a process unit group composed of a plurality of etching units each having a substantially identical structure, and which is configured to perform an etching process using a pattern formed by the lithography process as a mask,
wherein:
the substrate transfer means is also configured to transfer a substrate to and from the etch processing part;
the judging means also has a function for judging whether an etching process to be performed to a substrate from now is a first etching process to the substrate, or a second or more etching process to the substrate; and
the determining means is configured to select an etching unit used in an etching process performed to the substrate most recently, as an etching unit to be used in the etching process to be performed to the substrate from now, if the judging means judges that the etching process to be performed to the substrate from now is a second or more etching process to the substrate.

11. The substrate processing system according to claim 9, wherein the determining means is configured such that, if the judging means judges that the lithography process to be performed to the substrate from now is a second or more lithography process to the substrate, the determining means selects process units to be used in the lithography process to be performed to the substrate from now in such a manner that at least one of a process unit selected for performing the resist coating step, a process unit selected for performing the post-exposure baking step and a process unit selected for performing the developing step is identical to a process unit used in an lithography process performed to the substrate most recently.

12. The substrate processing system according to claim 10, wherein the determining means is configured such that, if the judging means judges that the lithography process to be performed to the substrate from now is a second or more lithography process to the substrate, the determining means selects process units to be used in the lithography process to be performed to the substrate from now in such a manner that at least one of a process unit selected for performing the resist coating step, a process unit selected for performing the post-exposure baking step and a process unit selected for performing the developing step is identical to a process unit used in an lithography process performed to the substrate most recently.

* * * * *